(12) United States Patent
Mishima et al.

(10) Patent No.: US 9,299,573 B2
(45) Date of Patent: Mar. 29, 2016

(54) POLISHING METHOD

(71) Applicant: HITACHI CHEMICAL COMPANY, LTD., Tokyo (JP)

(72) Inventors: Kouji Mishima, Hitachi (JP); Masato Fukasawa, Hitachi (JP); Masaya Nishiyama, Hitachi (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 14 days.

(21) Appl. No.: 14/384,729

(22) PCT Filed: Mar. 12, 2013

(86) PCT No.: PCT/JP2013/056723
§ 371 (c)(1),
(2) Date: Sep. 12, 2014

(87) PCT Pub. No.: WO2013/137220
PCT Pub. Date: Sep. 19, 2013

(65) Prior Publication Data
US 2015/0031205 A1 Jan. 29, 2015

(30) Foreign Application Priority Data
Mar. 14, 2012 (JP) ................................. 2012-056967

(51) Int. Cl.
*H01L 21/304* (2006.01)
*H01L 21/306* (2006.01)
(Continued)

(52) U.S. Cl.
CPC ............ *H01L 21/30625* (2013.01); *B81C 1/00* (2013.01); *C09G 1/00* (2013.01);
(Continued)

(58) Field of Classification Search
CPC ....................... H01L 21/3212; H01L 21/30625; H01L 2224/11616; C09G 1/00; C09G 1/02; C09G 1/04; C09G 1/06; C09K 13/06; C09K 3/1463; C09K 3/1409; B81C 2201/0104; B24B 1/00
See application file for complete search history.

(56) References Cited

U.S. PATENT DOCUMENTS 6,561,876 B1 * 5/2003 Tateyama et al. ............... 451/41
2006/0111024 A1 * 5/2006 Wang ............................... 451/41
(Continued)

FOREIGN PATENT DOCUMENTS

CN 101311205 A 11/2008
JP 2006-253206 A 9/2006
(Continued)

OTHER PUBLICATIONS

Notification of Transmittal of Translation of the International Preliminary Report on Patentability mailed Sep. 25, 2014, for International Application No. PCT/JP2013/056723.
(Continued)

*Primary Examiner* — Jiong-Ping Lu
(74) *Attorney, Agent, or Firm* — Fitch, Even, Tabin & Flannery, LLP

(57) ABSTRACT

Provided is a polishing method that polishes a substrate having (1) silicon nitride as a stopper, and, on the stopper, (2) at least a portion of a wiring metal, and (3) at least a portion of an insulating material. The method includes a step of supplying a CMP slurry, and thereby polishing the (2) wiring metal and (3) insulating material. The CMP slurry contains (A) a copolymer of (a) a monomer that is anionic and does not contain a hydrophobic substituent and (b) a monomer containing a hydrophobic substituent; (B) an abrasive grain; (C) an acid; (D) an oxidizing agent; and (E) a liquid medium, the component (B) has a zeta potential of +10 mV or more in the CMP slurry, and the copolymerization ratio (a):(b) of the component (A) is 25:75 to 75:25 as a molar ratio, with the pH being 5.0 or less.

17 Claims, 2 Drawing Sheets

(51) Int. Cl.
*C09K 13/06* (2006.01)
*C09K 3/14* (2006.01)
*C09G 1/00* (2006.01)
*C09G 1/04* (2006.01)
*C09G 1/06* (2006.01)
*B81C 1/00* (2006.01)
*H01L 21/321* (2006.01)
*H01L 21/768* (2006.01)
*C09G 1/02* (2006.01)
*H01L 21/3105* (2006.01)

(52) U.S. Cl.
CPC . *C09G 1/02* (2013.01); *C09G 1/04* (2013.01); *C09G 1/06* (2013.01); *C09K 3/1409* (2013.01); *C09K 3/1436* (2013.01); *C09K 3/1463* (2013.01); *C09K 3/1472* (2013.01); *C09K 13/06* (2013.01); *H01L 21/3212* (2013.01); *H01L 21/7684* (2013.01); *H01L 21/76898* (2013.01); *H01L 21/31053* (2013.01)

(56) References Cited

U.S. PATENT DOCUMENTS

| | | | | |
|---|---|---|---|---|
| 2007/0218811 | A1* | 9/2007 | Kurata et al. | 451/28 |
| 2008/0003925 | A1 | 1/2008 | Fukasawa et al. | |
| 2012/0142190 | A1* | 6/2012 | Tsao et al. | 438/692 |

FOREIGN PATENT DOCUMENTS

| | | |
|---|---|---|
| JP | 2009-272601 A | 11/2009 |
| JP | 2011-103498 A | 5/2011 |
| WO | 2009/005143 A1 | 1/2009 |
| WO | 2009/119485 A1 | 10/2009 |
| WO | 2011/021599 A1 | 2/2011 |

OTHER PUBLICATIONS

Office Action mailed Jan. 12, 2016, for Chinese Application No. 201380013722.4, together with English language translation thereof.

* cited by examiner

POLISHING METHOD

TECHNICAL FIELD

The present invention relates to a polishing method using chemical mechanical polishing, which is used for polishing in a wiring forming process for semiconductor devices and the like.

BACKGROUND ART

In recent years, along with high integration and performance enhancement of large scale integrations (hereinafter, referred to "LSI"), new microprocessing technologies have been developed. Polishing methods based on Chemical Mechanical Polishing (hereinafter, referred to as "CMP") (hereinafter, referred to as "CMP methods") constitute a class thereof. A CMP method is utilized in LSIproduction processes, and is a technology that is frequently utilized particularly in the flattening of interlayer insulating materials, formation of metal plugs, and formation of embedded wirings in a multilayer wiring forming process.

For the formation of embedded wirings, a damascene method is mainly employed. That is, the damascene method is a method of forming an embedded wiring by depositing a thin film of copper or a copper alloy on an insulating material (interlayer insulating material) on which concavities (grooves) and convexities (protrusions) have been formed in advance, embedding the copper or copper alloy in the concavities, and subsequently removing the thin film deposited on the convexities (thin film in areas other than the concavities) by CMP.

On the other hand, in the under part of the wiring metal such as copper or the copper alloy, a region formed from a conductor such as, for example, tantalum, a tantalum alloy, or tantalum nitride is formed as a barrier section for preventing diffusion of the wiring metal into the interlayer insulating material or for enhancing adhesiveness. In areas other than the wiring section where the wiring metal such as copper or the copper alloy is embedded, it is necessary to eliminate the exposed barrier section by CMP. Meanwhile, the metal used in the barrier section will be hereinafter referred to as a barrier metal.

In such a damascene method, generally, polishing is carried out in plural steps such that plural kinds of CMP polishing slurries (hereinafter, may be simply referred to as "slurry") are prepared, only the wiring metal is removed by polishing, and then eliminating only the barrier metal or the barrier metal and the interlayer insulating material by polishing. This is because since a slurry achieves polishing by a synergistic effect of a chemical action and a mechanical action, if it is desired to eliminate by polishing a particular material as a polishing object, an exclusive slurry for the particular material is required. A CMP method of polishing only the wiring metal such as described above is described in, for example, in Patent Literature 1, and a CMP method of polishing the barrier metal and the interlayer insulating material is described in, for example, Patent Literature 2.

In a slurry, various additives are added for the purpose of increasing the polishing rate with respect to a polishing object, or of enhancing the flatness of the surface after polishing. For example, Patent Literature 3 describes, in regard to a CMP method of polishing a barrier metal and an interlayer insulating material, a technology of increasing the polishing rate with respect to the interlayer insulating material and suppressing erosion or seaming by incorporating a methacrylic acid-based polymer into the slurry.

In recent years, application of the CMP technology in a wider variety of applications as a result of the progress in the LSI forming technology and the slurry used in CMP. Furthermore, even for conventional applications, since new materials are being applied to the conductive material, the barrier metal, the interlayer insulating material and the like, there are available a wide range of the polishing object for the CMP method.

As the range of applications of CMP has been broadened as a result of the emergence of new polishing object, the slurry is required to have new polishing characteristics. For example, a polishing method of removing the polishing object at a high polishing rate and stopping polishing at an arbitrary thickness should be carried out such that a substrate having a stopper is provided in the under part of a polishing object, the polishing object is removed using a slurry, and polishing is terminated at the time point where the stopper is exposed. However, in the damascene method, the polishing method of stopping polishing using a stopper is usually not carried out, and therefore, a slurry suitable for that purpose has not been developed, either. For example, in regard to the conventional slurries described in Patent Literatures 1 to 3, the respective polishing rates with respect to metal and interlayer insulating material are described, but nothing has been mentioned about polishing a substrate having a material such as a stopper, in addition to the above-described materials.

CITATION LIST

Patent Literatures

Patent Literature 1: WO 2009/119485
Patent Literature 2: WO 2011/021599
Patent Literature 3: WO 2009/005143

SUMMARY OF INVENTION

Problem to be Solved by Invention

In the case of the CMP method using a stopper, in order to remove the polishing object that is present on top of the stopper at a high polishing rate, it is necessary to intensify the mechanical action of CMP by means of the abrasive grain of the slurry or the like. However, in that case, that is a problem that it is prone to remove of stopper as well at the same time.

In order to stop polishing at the stopper with high accuracy while removing the polishing object that is present on top of the stopper at a high polishing rate, the ratio of the polishing rate for the polishing object and the polishing rate for the stopper needs to be large. This ratio of polishing rates is also called the "selectivity between the polishing object and the stopper". The ratio of the polishing rates between the polishing object and the stopper being large is said that the selectivity is high (high selectivity).

However, as discussed above, in recent years, the structures of LSI's have become more complicated and diverse as a result of the progress in the LSI forming technology. For instance, there has been suggested a structure in which metal such as a wiring metal and a barrier metal, and insulating material such as silicon oxide are employed as the polishing object, while silicon nitride, silicon carbide and the like are employed as the stopper.

In a case in which the polishing object is metal such as a wiring metal and a barrier metal, and insulating material such as silicon oxide, while the stopper is silicon nitride, silicon carbide and the like, it may be considered that the CMP rates for some of the polishing object (for example, the barrier metal and silicon oxide) and the material used as the stopper are more likely to be affected by a mechanical action rather than a chemical action. Therefore, it is difficult to increase the selectivity between the insulating material and the stopper, while maintaining the polishing rate with respect to metal.

The present invention is intended to solve these problems, and an object of the invention is to provide a polishing method in which the CMP rate against metal such as a wiring metal and a barrier metal is favorable, and the selectivity between an insulating material and a stopper is high. Thereby, a structure for which production has been traditionally difficult (particularly, an LSI structure) can be obtained.

Means for Solving Problems

The inventors of the present invention conceived that if a part that protects the stopper upon performing CMP using a CMP slurry is formed, and the effect of the abrasive grain is reduced, the polishing rate for the stopper may be slowed, and the problems described above can be overcome. Thus, the inventors conducted a thorough investigation.

The present invention was achieved by finding that the selectivity of the insulating material/stopper can be increased by a polishing method in which a wiring metal, a barrier metal and an insulating material are employed as the polishing object, silicon nitride is employed as a stopper, and a slurry which includes a copolymer of an anionic monomer and a monomer containing a hydrophobic substituent is used.

Specific embodiments of the present invention relate to the following.

(1) A polishing method including:
a step of preparing a substrate which has silicon nitride as a stopper, a wiring metal, and an insulating material, and has at least a portion of the wiring metal and at least a portion of the insulating material, to a direction of a surface subjected to polishing from the stopper;
a step of supplying a CMP slurry in between the surface subjected to polishing of the substrate and a polishing pad, and thereby polishing the wiring metal and the insulating material that are positioned to the direction of the surface subjected to polishing from the silicon nitride; and
a step of stopping polishing, before the silicon nitride is exposed and the silicon nitride is completely removed,
wherein the CMP slurry contains:
(A) a copolymer of (a) a monomer that is anionic and does not contain a hydrophobic substituent, and (b) a monomer containing a hydrophobic substituent;
(B) an abrasive grain;
(C) an acid;
(D) an oxidizing agent; and
(E) a liquid medium,
the component (B) has a zeta potential of +10 mV or more in the CMP slurry, and
the component (A) has copolymerization ratio between (a) and (b), wherein ((a):(b)) is 25:75 to 75:25 as a molar ratio, and
a pH is 5.0 or less.

(2) A polishing method including:
a step of preparing a substrate which has silicon nitride as a stopper, a wiring metal, a barrier metal, and an insulating material, and has at least a portion of the wiring metal, at least a portion of the barrier metal, and at least a portion of the insulating material, to a direction of a surface subjected polishing from the stopper;
a step of supplying a CMP slurry in between the surface subjected to polishing of the substrate and a polishing pad, and polishing the wiring metal, the barrier metal and the insulating material that are positioned to the direction of the surface subjected to polishing from the silicon nitride; and
a step of stopping polishing, before the silicon nitride is exposed and the silicon nitride is completely removed,
wherein the CMP slurry contains:
(A) a copolymer between (a) a monomer that is anionic and does not contain a hydrophobic substituent, and (b) a monomer containing a hydrophobic substituent;
(B) an abrasive grain;
(C) an acid;
(D) an oxidizing agent; and
(E) a liquid medium,
the component (B) has a zeta potential of +10 mV or more in the CMP slurry, and
the component (A) has copolymerization ratio of (a) and (b), wherein ((a):(b)) is 25:75 to 75:25 as a molar ratio, and
a pH is 5.0 or less.

(3) A polishing method including:
a step of preparing a substrate which has silicon nitride as a stopper, a wiring metal, a barrier metal and an insulating material, and has at least a portion of the wiring metal, at least a portion of the barrier metal, and at least a portion of the insulating material to a direction of a surface subjected to polishing from the stopper, and further has a section in which the silicon nitride, the insulating material, the barrier metal and the wiring metal are laminated in this order on the surface subjected to polishing;
a first polishing step of removing at least a portion of the wiring metal that is positioned to the direction of the surface subjected to polishing from the silicon nitride, and thereby exposing a portion of the barrier metal; and
a second polishing step of removing by CMP at least a portion of the barrier metal and a portion of the insulating material that are positioned to the direction of the surface subjected to polishing from the silicon nitride, thereby exposing the silicon nitride, and stopping polishing before the silicon nitride is completely removed,
at least the second polishing step including supplying a CMP slurry in between the surface subjected to polishing of the substrate and a polishing pad,
wherein the CMP slurry contains:
(A) a copolymer between (a) a monomer that is anionic and does not contain a hydrophobic substituent, and (b) a monomer containing a hydrophobic substituent;
(B) an abrasive grain;
(C) an acid;
(D) an oxidizing agent; and
(E) a liquid medium,
the component (B) has a zeta potential of +10 mV or more in the CMP slurry, and
the component (A) has the copolymerization ratio of (a) and (b), wherein ((a):(b)) is 25:75 to 75:25 as a molar ratio, and
a pH is 5.0 or less.

(4) The polishing method described in any of the items (1) to (3), wherein regarding the CMP slurry, the ratio of the polishing rate for the insulating material with respect to the polishing rate for the silicon nitride (polishing rate against the insulating material/polishing rate against silicon nitride) is 20 or more.

(5) The polishing method described in any of the items (1) to (3), wherein the (a) monomer that is anionic and does not contain a hydrophobic substituent is at least one selected from the group consisting of acrylic acid and maleic acid.

(6) The polishing method described in any of the items (1) to (3), wherein the (b) monomer containing a hydrophobic substituent is at least one selected from the group consisting of methacrylic acid, methyl methacrylate, ethyl methacrylate, propyl methacrylate, butyl methacrylate, 2-ethylacrylic acid, 2-propylacrylic acid, and 2-butylacrylic acid.

(7) The polishing method described in any of the items (1) to (3), wherein the component (A) is a copolymer of acrylic acid and methacrylic acid.

(8) The polishing method described in any of the items (1) to (3), wherein the component (B) is at least one selected from the group consisting of silica, alumina, ceria, titania, zirconia, germania, and modification products thereof.

(9) The polishing method described in any of the items (1) to (3), wherein the component (C) is an organic acid.

(10) The polishing method described in any of the items (1) to (3), wherein the CMP slurry further contains a metal corrosion inhibitor as the component (F).

The disclosure of the present application relates to the subject matter described in Japanese Patent Application No. 2012-056967 tiled on Mar. 14, 2012, the disclosure of which is incorporated herein by reference.

Advantageous Effects of Invention

According to the present invention, a high selectivity of stopping polishing with a stopper can be realized, while a metal and an insulating material such as an interlayer insulating material are removed at a high polishing rate. Thereby, a high processing accuracy can be maintained, and the process time can also be shortened. According to the polishing method of the invention, the CMP technology is made applicable to processes other than the wiring forming process or the metal embedded pattern forming process, and semiconductor devices having high dimensional accuracy can be designed and produced.

MODES FOR CARRYING OUT THE INVENTION (Definitions)

In the descriptions of the invention, the phrases "material A is polished" and "polishing of material A" are defined such that at least a portion of the material A is removed by polishing. A "high CMP rate" is defined such that the rate at which the material being polished is removed by CMP (for example, the amount of reduction of the thickness per unit time) is large.

Furthermore, the "selectivity of material A/material B" (selectivity of material A with respect to material B) is defined as (polishing rate for material A/polishing rate for material B).

Furthermore, the term "(meth)acrylic acid" is intended to mean acrylic acid, and methacrylic acid corresponding thereto. The term "(meth)acrylamide" is intended to mean acrylamide, and methacrylamide corresponding thereto.

Furthermore, a numerical value range expressed using the term "to" represents a range which includes the numerical values described before and after the term "to" as the minimum value and the maximum value, respectively.

Hereinafter, embodiments of the present invention will be described in detail.

[Polishing Method]
(First Embodiment)

A first embodiment of the polishing method of the present invention relates to a polishing method including:

a step of preparing a substrate which has silicon nitride as a stopper, a wiring metal, and an insulating material, and has at least a portion of the wiring metal and at least a portion of the insulating material to a direction of a surface subjected to polishing from the stopper;

a step of supplying a CMP slurry in between the surface subjected to polishing of the substrate and a polishing pad, and thereby polishing the wiring metal and the insulating material that are positioned to the direction of the surface subjected to polishing from the silicon nitride; and a step of stopping polishing, before the silicon nitride is exposed, and the silicon nitride is completely removed, wherein the CMP slurry contains:

(A) a copolymer of (a) a monomer that is anionic and does not contain a hydrophobic substituent, and (b) a monomer containing a hydrophobic substituent;

(B) an abrasive grain;

(C) an acid;

(D) an oxidizing agent; and (E) a liquid medium, the component (B) has a zeta potential of +10 mV or more in the CMP slurry, and the component (A) has a copolymerization ratio between (a) and (b), wherein ((a):(b)) is 25:75 to 75:25 as a molar ratio, and a pH is 5.0 or less.

In regard to the substrate that is prepared, an object to be removed by polishing is the wiring metal and the insulating material that are positioned to the direction of the surface subjected to polishing from the stopper, and are at least a portion of the wiring metal and at least a portion of the insulating material on the substrate.

Figure 1:
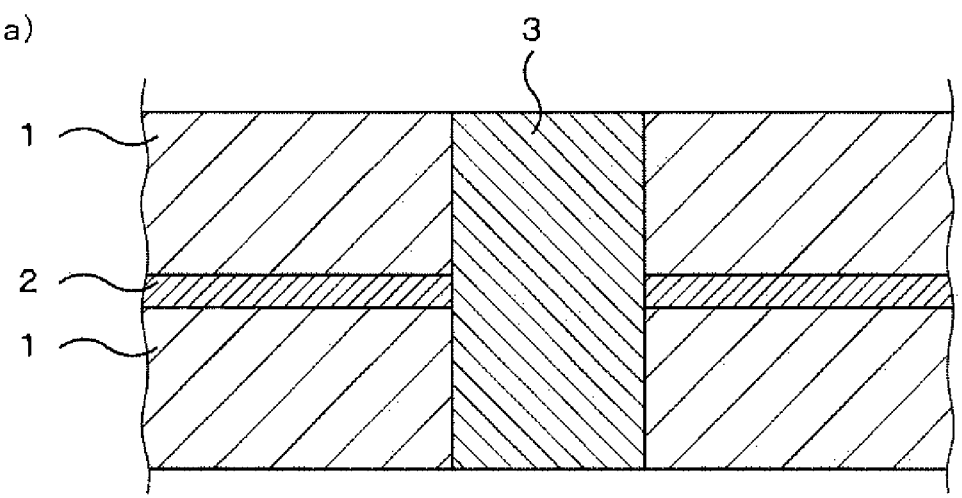
FIGS. 1(a) and 1(b) are schematic cross-sectional views illustrating an exemplary CMP polishing process for a substrate using the polishing method of the present invention.
Figure 1:
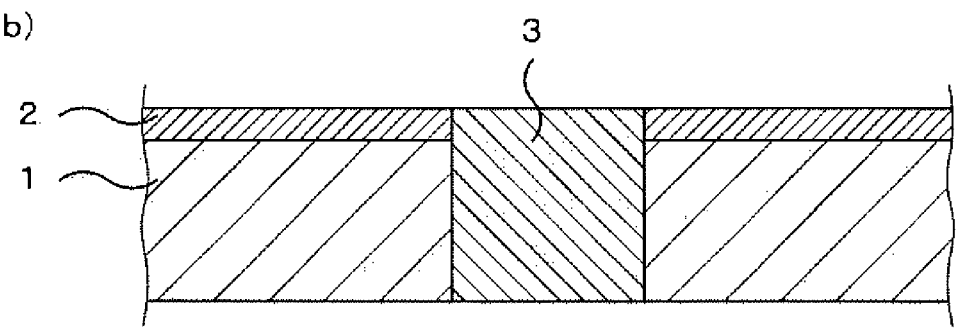

FIGS. 1(a) and 1(b) are schematic cross-sectional views illustrating the polishing process for a substrate based on the first embodiment, as an example to which the polishing method of the present invention can be suitably applied. In FIG. 1(a), numerical reference 1 represents an interlayer insulating film formed of an insulating material; numerical reference 2 represents a stopper formed of silicon nitride; and numerical reference 3 represents a wiring metal.

As can be seen from FIG. 1(a), the substrate is preferably formed such that an interlayer insulating film 1, a stopper 2, and an interlayer insulating film 1 are laminated in this order, and a wiring metal 3 is provided thereon. The wiring metal 3 may also be provided so as to penetrate through the laminate.

In the step of performing polishing, a slurry is supplied in between the surface subjected to polishing of the substrate and a polishing pad. The slurry according to the present invention will be described below.

When such a substrate is polished, the interlayer insulating film 1 and the wiring metal 3 that are positioned to the surface subjected to polishing from the stopper 2, are removed. Since the slurry used for the polishing method of the present invention has a sufficiently low polishing rate against silicon nitride, a structure illustrated in FIG. 1(b), in which the stopper 2 is completely exposed and remains unremoved, can be obtained. At this time, a portion of the stopper 2 may be polished away, but complete removal thereof should be avoided.

(Second Embodiment)

A second embodiment of the polishing method of the present invention relates to a polishing method including:

a step of preparing a substrate which has silicon nitride as a stopper, a wiring metal, a barrier metal and an insulating material, and has at least a portion of the wiring metal, at least a portion of the barrier metal, and at least a portion of the insulating material to the direction of the surface subjected to polishing from the stopper;

a step of supplying a CMP slurry in between the surface subjected to polishing of the substrate and a polishing pad, and thereby polishing the wiring metal, the barrier metal, and the insulating material that are positioned to the surface subjected to polishing from the silicon nitride; and a step of stopping polishing, before the silicon nitride is exposed, and the silicon nitride is completely removed, wherein the CMP slurry contains:

(A) a copolymer of (a) a monomer that is anionic and does not contain a hydrophobic substituent, and (b) a monomer containing a hydrophobic substituent;

(B) an abrasive grain;

(C) an acid;

(D) an oxidizing agent; and (E) a liquid medium, the component (B) has a zeta potential of +10 mV or more in the CMP slurry, and the component (A) has a copolymerization ratio between (a) and (b), wherein ((a):(b)) is 25:75 to 75:25 as a molar ratio, and a pH is 5.0 or less.

The substrate that is prepared further includes a barrier metal in the substrate prepared in the first embodiment, and the polishing object further include at least a portion of the barrier metal. That is, the object to be removed by polishing is a barrier metal and insulating material that are positioned to the direction of the surface subjected to polishing from the stopper, and are at least a portion of the barrier metal and at least a portion of the insulating material on the substrate. In regard to the substrate, the order of lamination to the direction of the surface subjected to polishing from the stopper, is preferably in the order of at least the stopper, the insulating material, and the barrier metal.

The substrate may be provided such that the wiring metal penetrates through the laminate, similarly to the first embodiment. When the wiring metal penetrates the laminate, the barrier metal is preferably disposed so as to coat the surface of the laminate other than the wiring metal. Thereby, the barrier metal can prevent the contact between the wiring metal and the insulating material.

This substrate is polished in the same manner as in the first embodiment to remove the barrier metal and the insulating material to the direction of the surface subjected to polishing from the silicon nitride as the stopper, and polishing is stopped in a state in which the stopper is exposed. That is, since the slurry used for the polishing method of the present invention has a sufficiently low polishing rate against silicon nitride that is used as the stopper, the stopper is completely exposed and remains unremoved. At this time, a portion of the stopper may be polished away, but complete removal is avoided. Meanwhile, when the substrate further has a wiring metal, the wiring metal, the barrier metal, and the insulating material are removed, and polishing is stopped in a state in which the stopper is exposed.

An example to which the second embodiment of the present invention can be suitably applied may be a through-silicon via (TSV) forming process. Various methods have been suggested as the TSV forming method, but a specific example may be a method called VIA-LAST, by which vias are formed after a device is formed.

Figure 2:
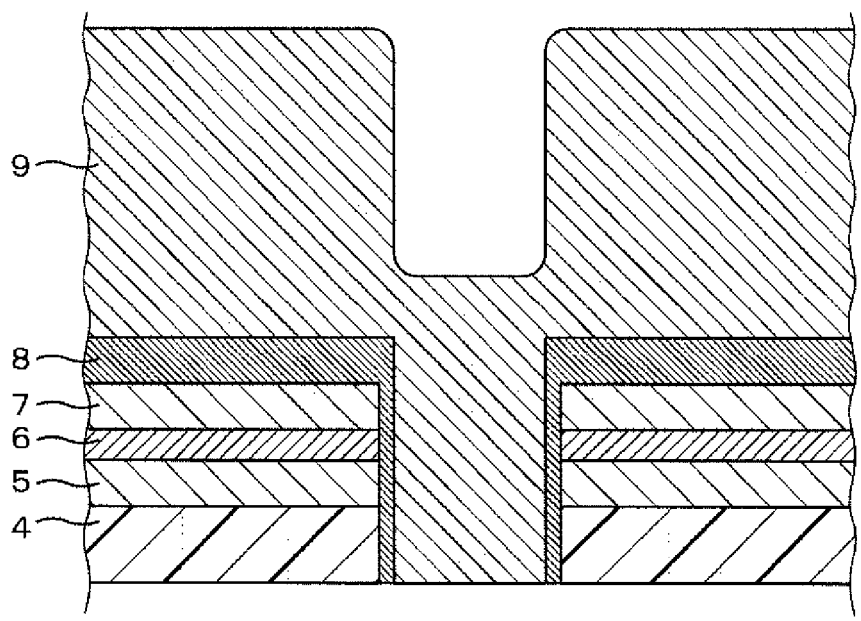
FIGS. 2(a) to 2(c) are schematic cross-sectional views illustrating an exemplary CMP polishing process for a TSV substrate using the polishing method of the present invention.
Figure 2:
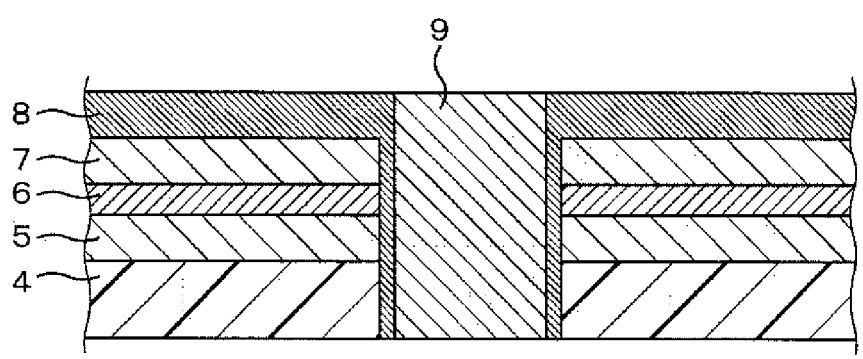
Figure 2:
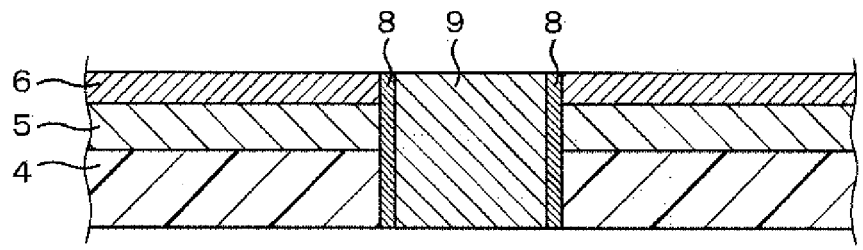

FIGS. 2(a) to 2(c) illustrate a substrate in an intermediate stage of TSV formation by VIA-LAST based on the second embodiment. When it is desired to produce the substrate illustrated in FIG. 2(a), first, an interlayer insulating material 5, a stopper 6, and an interlayer insulating material 7 are formed in this order on a silicon substrate 4. The interlayer insulating film 1 is preferably formed by the interlayer insulating materials 5 and 7.

Next, through-vias are formed. Furthermore, a barrier metal 8 is formed so as to cover the interlayer insulating material 5, the stopper 6, the interlayer insulating material 7, and the through-vias. Finally, a wiring metal 9 is laminated so as to embed the concavities of the through-vias by methods such as sputtering and electroplating, and thus a substrate having the structure illustrated in FIG. 2(a) is obtained.

Subsequently, the wiring metal 9 is subjected to CMP using a slurry in the first polishing step, the barrier metal 8 is exposed, and thus a substrate having the structure illustrated in FIG. 2(b) is obtained. The slurry used for the first polishing step is not particularly limited as long as the slurry is a slurry having a sufficiently large polishing rate ratio of wiring metal/barrier metal. As a result of the polishing of the first polishing step, at least a portion of the wiring metal on the direction of the surface subjected to polishing from the silicon nitride as the stopper is removed, and a portion of the barrier metal is exposed to the surface to be polished. Depending on the polishing conditions, there are occasions in which a light amount of the wiring metal on the direction of/be surface subjected to polishing from the barrier metal may remain, but since the wiring metal can also be polished in the subsequent steps, there is no problem if most of the wiring metal has been removed. Thus, a substrate to be polished according to the present embodiment is prepared.

The polishing step according to the second embodiment is a second polishing step of subjecting the substrate obtained in the first polishing step to CMP using the slurry according to the polishing method of the present invention. Since the slurry can grind the wiring metal, the barrier metal, and the insulating material, what is removed by polishing of the second polishing step includes at least a portion of the barrier metal and a portion of the insulating material. Specifically, the polishing object is the barrier metal and the insulating material on the direction of the surface subjected to polishing from silicon nitride, which is the stopper 6. Furthermore, since the slurry according to the polishing method of the present invention has a sufficiently low polishing rate against the silicon nitride used as the stopper 6, polishing is stopped in a state in which the stopper 6 is completely exposed, and remains unremoved. Thus, a substrate having the structure illustrated in FIG. 2(c) is obtained. At this time, a portion of the stopper 6 may be polished, but complete removal thereof should be avoided.

(Third Embodiment)

A third embodiment of the polishing method of the present invention is a polishing method including:

a step of preparing a substrate which has silicon nitride as a stopper, a wiring metal, a barrier metal and an insulating material, has at least a portion of the wiring metal, at least a portion of the barrier metal, and at least a portion of the insulating material to the direction of the surface subjected to polishing from the stopper, and further has a section in which the silicon nitride, the insulating material, the barrier metal, and the wiring metal are laminated in this order on the direction of the surface subjected to polishing;

a first polishing step of removing at least a portion of the wiring metal positioned to a direction of a surface subjected to polishing from silicon nitride, and exposing a portion of the barrier metal; and a second polishing step of removing by CMP at least a portion of the barrier metal and a portion of the insulating material that are positioned to the direction of the surface subjected to polishing from the silicon nitride, thereby exposing the silicon nitride, and stopping polishing before the silicon nitride is completely removed, at least the second polishing step including supplying a CMP slurry in between the surface subjected to polishing of the substrate and a polishing pad, wherein the CMP slurry contains:

(A) a copolymer of (a) a monomer that is anionic and does not contain a hydrophobic substituent, and (b) a monomer containing a hydrophobic substituent;

(B) an abrasive grain;

(C) an acid;

(D) an oxidizing agent; and (E) a liquid medium, the component (B) has a zeta potential of +10 mV or more in the CMP slurry, and the component (A) has a copolymerization ratio between (a) and (b), wherein ((a):(b)) is 25:75 to 75:25 as a molar ratio, and a pH is 5.0 or less.

According to the third embodiment, the substrate that is prepared is a substrate further including a section where a wiring metal is further laminated on the laminate of the stopper, the insulating material, and the barrier metal in this order of the substrate that is prepared in the second embodiment. That is, the object to be removed in the first and second polishing steps in the third embodiment is the wiring metal, the barrier metal, and the insulating material that are positioned on a direction of a surface subjected to polishing from the stopper, and are at least a portion of the wiring metal, at least a portion of the barrier metal, and at least a portion of the insulating material on the substrate.

Furthermore, according to the third embodiment of the present invention, the substrate that is prepared has a section in which the silicon nitride, the insulating material, the barrier metal, and the wiring metal are laminated in this order to the direction of the surface subjected to polishing.

An example to which the third embodiment of the present invention can be suitably applied may be the through-silicon via (TSV) forming process illustrated in FIGS. 2(a) to 2(c), as in the case of the second embodiment. That is, the third embodiment has, in regard to FIGS. 2(a) to 2(c), a first polishing step of from FIG. 2(a) to FIG. 2(b), and a second polishing step of from FIG. 2(b) to FIG. 2(c), and for at least the second polishing step, the slurry is used.

According to the third embodiment of the present invention, the slurry described above may be used as the slurry used in the first polishing step of from FIG. 2(a) to FIG. 2(b). In this case, it is preferable from the viewpoint that the processes from FIG. 2(a) to FIG. 2(c) can be carried out continuously without changing the composition of the slurry.

Next, the material of the substrate used for the polishing method of the present invention will be described.

The wiring metal may be a conductive material. Examples of the conductive material include copper (pure copper, a copper alloy, an oxide of copper, an oxide of a copper alloy, or the like), aluminum (pure aluminum, an aluminum alloy, an oxide of aluminum, or the like), tungsten (pure tungsten, a tungsten alloy, or the like), silver, and gold. Among these, from the viewpoint that the characteristic of the polishing method of the present invention of enabling the removal of metal at a high polishing rate can be best promoted, the wiring metal is preferably copper (pure copper), or a metal containing copper as a main component such as a copper alloy, an oxide of copper, or an oxide of a copper alloy. Meanwhile, the phrase "containing copper as a main component" means that the content of copper is more than 50% by mass. Film forming of the conductive material can be carried out by a known sputtering method, a known plating method, or the like.

The barrier metal is defined as a metal that is used in the barrier part. The barrier part is formed in order to prevent diffusion of the conductive material as the wiring metal into the insulating material, and in order to increase the adhesiveness between the insulating material and the wiring metal. Examples of the constituent material of such a barrier metal include tungsten-related substances such as tungsten, a tungsten alloy, and a tungsten compound (for example, tungsten nitride); titanium-related substances such as titanium, a titanium alloy, and a titanium compound (for example, titanium nitride); tantalum-related substances such as tantalum, a tantalum alloy, and a tantalum compound (for example, tantalum nitride); and ruthenium-related substances such as ruthenium, a ruthenium alloy, and a ruthenium compound (for example, ruthenium nitride). Among them, from the viewpoint that the characteristic of the polishing method of the present invention of enabling the removal of metal at a high polishing rate can be best promoted, tantalum-related substances and titanium-related substances are preferred, and tantalum nitride and titanium nitride are more preferred. Furthermore, a laminate material having two or more layers can also be used as the barrier metal.

Film forming of the barrier metal is carried out by vapor deposition, CVD, or the like, so as to cover at least the insulating material (and if necessary, the through-vias and the like).

Examples of a material that constitutes the insulating material include insulating material and organic insulating material. Among them, from the viewpoint that the characteristic of the polishing method of the present invention of enabling shortening of the CMP process time can be best promoted, an insulating material is preferred; a silicon-based insulating material (defined as an insulating material containing Si as a constituent element) is more preferred, and among others, silicon oxides are more preferred. Examples of the silicon oxides include silicon dioxide ($SiO_2$), fluorosilicate glass, tetraethyl ortho-silicate, organosilicate glass (silicate glass obtainable by using trimethylsilane, dimethoxydimethylsilane, and the like as starting raw materials), silicon oxynitride, hydrogenated silsesquioxane, and silicon carbide. The insulating material can be formed on the substrate by a CVD method, a spin coating method, a dip coating method, or a spray method.

Regarding the material that constitutes the stopper, silicon nitride is preferred from the viewpoint that the characteristic of the polishing method of the present invention of obtaining high processing accuracy can be best promoted. Silicon nitride can also be formed on silicon oxide or the like by a CVD method or the like. In addition to that, silicon carbide and the like may be used in combination.

Regarding the polishing apparatus, for example, when polishing is carried out using an abrasive cloth, use can be made of a general polishing apparatus having a holder that can retain a substrate to be polished, and a polishing surface plate that is connected to a motor capable of changing the speed of rotation, or the like and can have an abrasive cloth attached thereto. The abrasive cloth is not particularly limited, and a general non-woven fabric, foamed polyurethane, a porous fluororesin, and the like can be used.

There are no limitations on the polishing conditions, but regarding the speed of rotation of the surface plate, a low speed of 200 $min^{-1}$ or less is preferred so as to prevent the substrate from popping out. The pressure of the substrate having a surface to be polished pressing against the abrasive cloth is preferably 1 kPa to 100 kPa, and in order to satisfy the uniformity of the polishing rate within the surface to be polished and the flatness of the pattern on the substrate, the pressure is more preferably 2 kPa to 50 kPa. It is preferable to continuously supply the slurry according to the present embodiment to the abrasive cloth using a pump or the like while polishing is performed. The amount of supply of this slurry is not limited, but it is preferable that the surface of the abrasive cloth be constantly covered with the slurry.

The substrate after the completion of polishing is preferably thoroughly washed under flowing water, followed by dropping of the water droplets adhering on the substrate using a spin dryer or the like, and then dried. Furthermore, it is more preferable to dry the substrate after using a known washing method of removing any attachments on the substrate by pressing, while rotating, a brush formed from polyurethane at a constant pressure, while causing a commercially available washing liquid to flow over the substrate surface.

In order to perform CMP by making the surface state of the abrasive cloth constantly identical, it is preferable to include a process for conditioning the abrasive cloth before polishing. For example, conditioning of the abrasive cloth with a conditioning liquid containing at least water is carried out using a dresser having diamond particles attached thereto. Subsequently, the polishing method related to the present embodiment is carried out, and it is preferable to add a substrate washing step.

As such, the polishing method of the present invention is characterized in that a wiring metal or a barrier metal can be polished, and an insulating material such as silicon oxide is polished at a satisfactory polishing rate, while the polishing rate against silicon nitride is low. Thus, the polishing method of the present invention can be used for the polishing of a substrate having a complicated structure such as illustrated in FIGS. 1(a) and 1(b) or FIGS. 2(a) to 2(c). Meanwhile, it is needless to say that as long as the effects exhibited the polishing method of the present invention can be utilized, the structure of the substrate that is subjected to polishing is not limited to the structure illustrated in FIGS. 1(a) and 1(b) or FIGS. 2(a) to 2(c).

Next, the slurry that can be suitably used for the above-described embodiments of the present invention will be described. Hereinafter, the wiring metal and the barrier metal will be collectively referred to as "metal".

The slurry according to the present invention relates to a slurry containing (A) a copolymer of (a) a monomer that is anionic and does not contain a hydrophobic substituent, and (b) a monomer containing a hydrophobic substituent; (B) an abrasive grain; (C) an acid; (D) an oxidizing agent; and (E) a liquid medium, and having a pH of 5.0 or less. When such a slurry is used, a high selectivity of the insulating material/stopper (for example, 20 or more) can be obtained, while the metal and the insulating material are removed at a high polishing rate. The monomer (a) that is anionic and does not contain a hydrophobic substituent will also be referred to hereinafter as an anionic monomer (a).

The inventors of the present invention speculate the mechanism by which the selectivity of the insulating material/stopper is increased when the slurry according to the present invention is used, as follows.

That is, the copolymer (A) contained in the slurry according to the present invention is negatively charged, as the substituent derived from the (a) anionic monomer is dissociated. It is speculated that thereby, the copolymer electrostatically pull against the stopper that is positively charged, and a protective area is formed at the stopper surface. Furthermore, it is speculated that since the copolymer contains a hydrophobic group derived from the (b) monomer containing a hydrophobic substituent, the hydrophilic abrasive grain is inhibited from approaching closer to the stopper. It is contemplated that the polishing rate against the stopper is slowed due to a synergistic effect of these factors.

On the other hand, since the copolymer does not adsorb to the insulating material having a negative charge, it is considered that the copolymer has no effect on decreasing the polishing rate of the insulating material. It is speculated that thereby, the selectivity between the insulating material and the stopper is increased.

Furthermore, since the polishing rate against metals is such that not only a mechanical action but also a chemical action contributes strongly, a favorable polishing rate may be obtained by having the composition of the slurry described above.

As such, it is contemplated that when the slurry according to the present invention is used, the mechanical action and the chemical action against the respective materials of the polishing object and the stopper are well adjusted, and thus the selectivity of the insulating material/stopper can be increased while the metals and the insulating material are removed at high polishing rates. The selectivity of the insulating material/stopper is preferably 20 or higher, more preferably 25 or higher, and even more preferably 30 or higher.

Hereinafter, the various components contained in the slurry according to the present invention will be described in detail.

[Component (A): Copolymer of Anionic Monomer and Monomer Containing Hydrophobic Substituent]

The slurry according to the present invention contains (A) a copolymer of (a) an anionic monomer and (b) a monomer containing a hydrophobic substituent. Thereby, the copolymer adsorbs to the stopper as a result of the action of the anionic moiety derived from the (a) anionic monomer, and can suppress the approach of the abrasive grain to the stopper as a result of the hydrophobic action derived from the (b) monomer containing a hydrophobic substituent. Therefore, the selectivity of the insulating material/stopper can be increased while the metals and the insulating material can be removed at high polishing rates.

Examples of the copolymer include a random copolymer, an alternating copolymer, a block copolymer, and a graft copolymer, between the (a) anionic monomer and the (b) monomer containing a hydrophobic substituent.

The (a) anionic monomer is preferably a monomer having an anionic substituent, and the monomer is not particularly limited as long as it has an anionic substituent but does not contain a hydrophobic substituent. Specific examples of the anionic substituent include a hydroxyl group, an aldehyde group, a carbonyl group, a carboxyl group, a nitro group, a sulfone group and a phosphone group. And among them, a carboxyl group is preferred. Among them, a monomer which dissociates in the slurry and is negatively charged is preferred. Specific examples of the (a) anionic monomer include acrylic acid and maleic acid. The (a) anionic monomer is more preferably at least one selected from the group consisting of acrylic acid and maleic acid.

The (b) monomer containing a hydrophobic substituent is not particularly limited as long as the monomer contains a hydrophobic substituent, and in addition to that, the monomer may also contain a hydrophilic substituent, or the substituent may be anionic. Here, examples of the hydrophobic substituent include an alkyl group and a phenyl group. Specific examples of the (b) monomer containing a hydrophobic substituent include methacrylic acid, methyl methacrylate, ethyl methacrylate, propyl methacrylate, butyl methacrylate, 2-ethylacrylic acid, 2-propylacrylic acid, and 2-butylacrylic acid. The (b) monomer containing a hydrophobic substituent is more preferably at least one selected from the group consisting of methacrylic acid, methyl methacrylate, ethyl methacrylate, propyl methacrylate, butyl methacrylate, 2-ethylacrylic acid, 2-propylacrylic acid, and 2-butylacrylic acid.

The component (A) is more preferably a copolymer of acrylic acid and methacrylic acid, from the viewpoint that the effect of increasing the selectivity of the insulating material/stopper while removing the metals and the insulating material at high polishing rates, is obtained more efficiently.

In regard to the slurry according to the present invention, from the viewpoint that enlargement of the abrasive grain can be sufficiently suppressed, and sedimentation of the abrasive grain can be prevented, it is preferable that the (b) monomer containing a hydrophobic substituent be present at a certain proportion in the (A) copolymer of the (a) anionic monomer and the (b) monomer containing a hydrophobic substituent. Specifically, the copolymerization ratio represented by the relationship: ((a) anionic monomer:(b) monomer containing a hydrophobic substituent) is preferably, as a molar ratio, 25:75 to 75:25, more preferably 35:65 to 65:35, and even more preferably 45:55 to 55:45.

The reason why sedimentation of the abrasive grain can be suppressed by controlling the copolymerization ratio may be considered as follows. That is, when the abrasive grain is positively charged, for example, in a homopolymer of the (a) anionic monomer, the moiety that is negatively charged as a result of dissociation of the anionic group electrostatically pulls against the stopper such as silicon nitride, and also electrostatically adsorbs to the abrasive grain. This adsorption occurs successively, and the abrasive grain is enlarged and leads to sedimentation. However, when a copolymer of the (a) anionic monomer and the (b) monomer containing a hydrophobic substituent is used, the hydrophobic substituent suppresses repeated binding of the abrasive grain and the anionic group, and thereby inhibits enlargement of the abrasive grain. It is considered that sedimentation of the abrasive grain can be prevented thereby. From the viewpoint that such an operating effect is obtained more efficiently, the component (A) is more preferably a copolymer of acrylic acid and methacrylic acid.

The weight average molecular weight (Mw) of the component (A) is preferably 500 or more, more preferably 1,500 or more, and even more preferably 5,000 or more, from the viewpoint of having a tendency that the copolymer can uniformly adsorb to the stopper surface and effectively suppress the stopper polishing rate. There are no particular limitations on the upper limit of the weight average molecular weight of the component (A), but from the viewpoint of solubility, the upper limit is preferably 5,000,000 or less in order to have sufficient water-solubility.

The weight average molecular weight of the component (A) can be measured by gel permeation chromatography under the following conditions, using a calibration curve of polystyrene standards.

(Conditions)
Sample: 10 μL, (L represents "liter"; the same will apply hereinafter)

Polystyrene standards: polystyrene standards manufactured by Tosoh Corp. (molecular weights: 190,000, 17,900, 9,100, 2,980, 578, 474, 370 and 266)

Detector: manufactured by Hitachi, Ltd., RI-monitor, trade name: L-3000

Integrator: manufactured by Hitachi, Ltd., GPC Integrator, trade name: D-2200

Pump: manufactured by Hitachi, Ltd., trade name: L-6000

Degassing apparatus: manufactured by Showa Denko K.K., trade name: Shodex DEGAS

Column: manufactured by Hitachi Chemical Co., Ltd., trade name: GL-R440, GL-R430, and GL-R420 are connected in this sequence and used Eluent: tetrahydrofuran (THF)
Measurement temperature: 23° C.
Flow rate: 1.75 mL/min
Measurement time: 45 min The content of the component (A) is preferably 0.001 parts by mass or more, more preferably 0.002 parts by mass or more, and even more preferably 0.005 parts by mass or more, relative to 100 parts by mass of the slurry, from the viewpoint that the selectivity between the insulating material and the stopper can be increased more effectively. Furthermore, from the viewpoint that the stability of the abrasive grain contained in the slurry tends to increase, the content of the component (A) is preferably 5 parts by mass or less, more preferably 2 parts by mass or less, and even more preferably 1 part by mass or less.

[Component (B): Abrasive Grain]

The slurry according to the present invention contains an abrasive grain. There are no particular limitations on the abrasive grain, but the abrasive grain is preferably at least one selected from the group consisting of silica, alumina, zirconia, ceria, titania, germania, and modification products thereof. An example of the modification products may be abrasive grain having the particle surfaces modified with alkyl group. Among the abrasive grain, silica is preferred from the viewpoint of easy availability, and colloidal silica is more preferred from the viewpoint of suppressing the generation of polishing scratches.

The primary diameter of the particles that constitute the abrasive grain (hereinafter, referred to as "primary particle size") is preferably 10 nm or more, and more preferably 25 nm or more, from the viewpoint of obtaining a favorable polishing rate against the insulating material. Furthermore, from the viewpoint of having excellent dispersion stability in the slurry, the primary particle size is preferably 60 nm or less, and more preferably 50 nm or less.

The primary particle size is calculated as follows, from the results obtained by observing any arbitrary twenty particles with a scanning electron microscope (SEM). That is, taking an example of abrasive particles that are usually dispersed in water at a solid content concentration of 5 wt % to 40 wt %, an appropriate amount of the abrasive particle dispersion liquid is taken, and in a container holding the liquid, a chip prepared by cutting a copper film-clad wafer to a size of 2 cm on each side was immersed for about 30 seconds. Subsequently, the chip is transferred to a container holding pure water to rinse the chip for about 30 seconds, and the chip is dried by blowing nitrogen. Thereafter, the chip is mounted on a sample platform for SEM observation, and the abrasive grain is observed at a magnification of 100,000 times by applying an accelerating voltage of 10 kV, with the images being captured. Twenty particles are arbitrarily selected from the images thus obtained.

For example, in a case in which a selected abrasive grain has a shape that is not truly spherical, abounding rectangle is drawn so as to circumscribe the abrasive grain, and is disposed such that the major axis will become longest. Then, the major axis of the bounding rectangle is designated as X, and the minor axis is designated as Y, and the biaxial average primary particle size is calculated by the formula: $(X+Y)/2$. This operation is carried out for the arbitrary twenty abrasive particles, and the average value of the values thus obtained is defined as the biaxial average primary particle size, which is called the primary particle size.

The surface potential in the slurry of the particles that constitute the abrasive grain is preferably +10 mV or more, and more preferably +15 mV or more, from the viewpoint of obtaining a favorable polishing rate against the insulating material. Furthermore, from the viewpoint of having excellent dispersion stability in the slurry, the surface potential of the abrasive grain is preferably less than +35 mV, and more preferably less than +30 mV.

Furthermore, when the surface potential of the abrasive grain is in the range described above, the abrasive grain electrostatically repel the positively charged stopper, and the abrasive grain cannot approach to the stopper. Therefore, the polishing effect of the abrasive grain can be reduced to an appropriate extent. Even from the viewpoint of suppressing the polishing rate for the stopper such as silicon nitride, favorable results are obtained if the surface potential of the abrasive grain is positive.

The surface potential refers to the zeta potential that can be converted using Henry's equation, from the electrophoretic mobility of particles. More specifically, the zeta potential of the slurry obtainable by laser Doppler detection type electrophoresis using a zeta potential analyzer (manufactured by Beckman Coulter, Inc., trade name: DELSA NANO C), may be designated as the surface potential.

Such abrasive grain can be used singly, or as mixtures of two or more thereof.

The content of the abrasive grain is preferably 0.01 parts by mass or more, more preferably 0.05 parts by mass or more, even more preferably 0.1 parts by mass or more, particularly preferably 1.0 part by mass or more, and ultimately preferably 3.0 parts by mass or more, relative to 100 parts by mass of the slurry, from the viewpoint that a favorable polishing rate against the polishing object may be obtained. Furthermore, from the viewpoint of having a tendency that the generation of polishing scratches may be suppressed, the content of the abrasive grain is preferably 50 parts by mass or less, more preferably 30 parts by mass, even more preferably 20 parts by mass, and particularly preferably 10 parts by mass or less.

[Component (C): Acid]

The slurry according to the present invention contains an acid. When the polishing object includes metal other than an insulating material and a stopper, the slurry can remove the metal at a favorable polishing rate by containing an acid.

Examples of the acid include organic acid materials such as organic acids, esters of organic acids, and salts of organic acids; and inorganic acid materials such as inorganic acids, and salts of inorganic acids, and there are no particular limitations as long as the acids are water-soluble. Examples of the salts include ammonium salts, alkali metal (sodium, potassium, and the like) salts, and alkaline earth metal (magnesium and calcium) salts. These acids can be used singly or as mixtures of two or more thereof.

Specific examples of the organic acids in connection with the organic acid materials include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and p-toluenesulfonic acid.

Specific examples of the inorganic acids in connection with the inorganic acid materials include hydrochloric acid, sulfuric acid, nitric acid, and chromic acid.

Specific examples of the salts of inorganic acids in connection with the inorganic acid materials include ammonium persulfate, ammonium nitrate, ammonium chloride, ammonium bichromate, and ammonium dichromate.

Among the acids described above, organic acid materials are preferred from the viewpoint of the metal etching characteristics. Furthermore, preferred examples of the organic acids include lactic acid, oxalic acid, succinic acid, adipic acid, glutaric acid, malic acid, malonic acid, maleic acid, tartaric acid, benzoic acid, salicylic acid, quinaldinic acid, butyric acid, valeric acid, glycolic acid, and glutaric acid.

The content of the acid is preferably 0.001 parts by mass or more, more preferably 0.01 parts by mass or more, even more preferably 0.05 parts by mass or more, and particularly preferably 0.1 parts by mass or more, relative to 100 parts by mass or the slurry, from the viewpoint of having a tendency that the polishing rate for metal may be obtained practically sufficiently. Furthermore, from the viewpoint that suppression of etching is facilitated, and there is a tendency that generation of roughness in the surface to be polished is suppressed, the content of the acid is preferably 20 parts by mass or less, more preferably 10 parts by mass or less, even more preferably 5 parts by mass or less, particularly preferably 3 parts by mass or less, and ultimately preferably 1 part by mass or less.

[Component (D): Oxidizing Agent]

The slurry according to the present invention further contains an oxidizing agent. When the slurry contains an oxidizing agent, a favorable polishing rate against metal may be obtained. There are no particular limitations on the oxidizing agent, but examples include hydrogen peroxide, periodates such as potassium periodate, persulfates (peroxosulfates), hypochlorites, and ozone water, and among them, hydrogen peroxide is preferred. These oxidizing agents can be used singly, or as mixtures of two or more thereof. When the substrate as an object of application is a silicon substrate including an integrated circuit device, contamination by alkali metal, alkaline earth metal, halides and the like is not desirable, and therefore, an oxidizing agent that does not contain non-volatile components is preferred. In addition, when the substrate as the object of application is a glass substrate or the like that does not include a semiconductor device, an oxidizing agent containing non-volatile components may also be used.

The content of the oxidizing agent is preferably 0.01 parts by mass or more, more preferably 0.02 parts by mass or more, and even more preferably 0.05 parts by mass or more, relative to 100 parts by mass of the slurry, from the viewpoint of having a tendency that oxidization of metal proceeds sufficiently, and the polishing rate is increased. Furthermore, from the viewpoint of having a tendency that roughness being generated at the surface to be polished is suppressed, the content is preferably 50 parts by mass or less, more preferably 30 parts by mass or less, and even more preferably 20 parts by mass or less, relative to 100 parts by mass of the slurry. Furthermore, in the case of obtaining a high polishing rate against the barrier metal, the content is preferably 10 parts by mass or less, more preferably 5 parts by mass or less, even more preferably 3 parts by mass or less, and particularly preferably 1.5 parts by mass or less, relative to 100 parts by mass of the slurry.

[Component (E): Liquid Medium]

The polishing liquid according to the present invention forms a liquid (a liquid in which solid abrasive grain is dispersed) by containing a liquid medium. The content of the liquid medium may be the balance of the contained components described above. Examples of the liquid medium include water and organic solvents.

The organic solvent that is used for the liquid medium is not particularly limited, but an organic solvent which can be arbitrarily mixed with water is preferred. In addition to the role as a liquid medium, the organic solvent may be used as a dissolution aid for components that do not easily dissolve in water, or may be used for the purpose of enhancing wettability of the polishing liquid to the surface to be polished and increasing the polishing rate against the insulating material. Particularly from the viewpoint that wettability to the insulating material is enhanced, the organic solvent is preferably at least one selected from carbonic acid esters, lactones, glycols and derivatives thereof, ethers, alcohols, ketones, phenols, amides, and sulfolanes. Specific examples of the organic solvent are described in detail in WO 2003/038883. These organic solvents can be used singly or as mixtures of two or more thereof.

The content of the organic solvent is preferably 0.1 parts by mass or more, more preferably 0.2 parts by mass or more, and even more preferably 0.3 parts by mass, relative to 100 parts by mass of the slurry, from the viewpoint that wettability of the slurry to the surface to be ground becomes sufficient. Furthermore, from the viewpoint of having a tendency that a decrease in dispersibility is suppressed, the content is preferably 50 parts by mass or less, more preferably 30 parts by mass or less, and even more preferably 10 parts by mass or less, relative to 100 parts by mass of the slurry.

[Component (F): Metal Corrosion Inhibitor]

In order to protect the surface of metal that are included in the polishing object from corrosion, the slurry for metal according to the present invention may further contain a metal corrosion inhibitor (hereinafter, referred to as "corrosion inhibitor"). Regarding the corrosion inhibitor for the slurry for metal of the present invention, any conventionally known substance can be used with any particular limitations as long as the substance has an action of forming a protective material for a metal surface, and has water-solubility to an extent effective for exhibiting this action. These can be used singly or as mixtures of two or more thereof. Furthermore, the corrosion inhibitor is particularly effective when a wiring metal is included in the polishing object. Therefore, in a case in which a wiring metal is not included in the polishing object, or it is not needed to grind a wiring metal to a large extent, it is not necessary to add the corrosion inhibitor. For example, in the first embodiment and the second embodiment, since the amount of the wiring metal to be polished is small compared with the third embodiment, the effect of adding the corrosion inhibitor is small. Therefore, in the first embodiment and the second embodiment, it is preferable not to include a corrosion inhibitor.

Examples of the corrosion inhibitor include quinaldinic acid, anthranilic acid, salicylaldoxime, triazole compounds, imidazole compounds, tetrazole compounds, pyrazole compounds, and pyrimidine compounds. And among them, triazole compounds are preferred.

The content of the corrosion inhibitor is preferably 0.001 parts by mass or more, more preferably 0.005 parts by mass or more, and particularly preferably 0.01 parts by mass or more, relative to 100 parts by mass of the slurry, from the viewpoint that suppression of etching for metal is facilitated, and there is a tendency that generation of roughness on the surface is suppressed. Furthermore, from the viewpoint of having a tendency that a decrease in the polishing rate for metal is suppressed, the content is preferably 10 parts by mass or less, more preferably 5 parts by mass or less, and particularly preferably 2 parts by mass or less, relative to 100 parts by mass of the slurry.

Examples of the triazole compounds include:

triazole derivatives such as 2-mercaptobenzothiazole, 1,2,3-triazole, 1,2,4-triazole, and 3-amino-1H-1,2,4-triazole; and benzotriazole derivatives such as benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, 1-acetyl-1H-1,2,3-triazolo[4,5-b]pyridine, 1H-1,2,3-triazolo[4,5-b]pyridine, 1,2,4-triazolo[4,3-a]pyridin-3(2H)-one, 3H-1,2,3-triazolo[4,5-b]pyridin-3-ol, bis[(1-benzotriazolyl)methyl]phosphonic acid, and 3-aminotriazole. Among these, it is more preferable to use benzotriazole derivatives.

Examples of the imidazole compounds include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, and 2-aminoimidazole.

Examples of the tetrazole compounds include 1H-tetrazole, 5-amino-1H-tetrazole, 5-methyl-1H-tetrazole, 5-phenyl-1H-tetrazole, and 1-(2-diaminoethyl)-5-mercaptotetrazole.

Examples of the pyrazole compounds include 3,5-dimethylpyrazole, 3-amino-5-methylpyrazole, 4-methylpyrazole, and 3-amino-5-hydroxypyrazole.

Examples of the pyrimidine compounds include compounds having a pyrimidine skeleton, such as pyrimidine, 1,2,4-triazolo[1,5-a]pyrimidine, 1,3,4,6,7,8-hexahydro-2H-pyrimido[1,2-a]pyrimidine, 1,3-diphenylpyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro(1,2,4)triazolo(1,5-a)pyrimidine, and 4-aminopyrazolo[3,4-d]pyrimidine.

[pH of Slurry]

The pH of the slurry according to the present invention is 5.0 or lower from the viewpoint that the stopper is positively charged, and the component (A) is easily adsorbed to the stopper. In consideration of the dispersibility of the abrasive grain, a pH is preferably 4.5 or lower, more preferably 4.0 or lower, and even more preferably 15 or lower. On the other hand, in consideration of the handleability of the slurry, the pH is preferably 1.0 or higher, more preferably 2.0 or higher, even more preferably 2.3 or higher, and particularly preferably 2.5 or higher.

Oh the other hand, at a pH of 4.0 or higher, it is effective for the adsorption of the component (A) to the stopper since the stopper is positively charged, and in a region lower than pH 4.0, it is effective from the viewpoint that a high polishing rate for silicon oxide is obtained. The pH can be determined in consideration of these factors.

The pH of the slurry according to the present invention can be adjusted to a desired pH by adjusting the content of the acid. Furthermore, the pH can also be adjusted by adding alkali components such as ammonia, sodium hydroxide, potassium hydroxide, and tetramethylammonium hydroxide.

The adjustment can also be made by adding an amino acid. However, since the presence of an amino group induces a decrease in the polishing rate for silicon oxide, and has a possibility of reducing the effects of the present invention, it is preferable to adjust the pH only by means of the content of the acid.

The pH of the slurry according to the present invention is measured using a pH meter (for example, product No.: PH81 manufactured by Yokogawa Electric Corp). Two-point calibration is carried out using a standard buffer solution (phthalate pH buffer solution pH: 4.01 (25° C.), neutral phosphate pH buffer solution pH 6.86 (25° C.)), subsequently an electrode is immersed in the slurry, and a stabilized value after a lapse of 3 minutes or longer is employed.

EXAMPLES

Hereinafter, the present invention will be described in more detail by way of Examples, but the present invention is not intended to be limited to these Examples as long as the technical idea of the present invention is maintained. For example, regarding the kind of the material used in the slurry or a mixing ratio thereof, any kind or ratio other than those described in the present Examples may be used without limitations, and also, regarding the composition or structure of the polishing object, any composition or structure other than that described in the present Examples may be used without limitations.

(Experiment 1: Influence of Abrasive Grain)

Reference Example 1

0.20 parts by mass of malic acid and 73.80 parts by mass of water were mixed and stirred, and dissolution of malic acid was visually checked. Subsequently, 25.00 parts by mass of colloidal silica A (silica content 20% by mass) was added thereto, and the mixture was stirred. After the color of the slurry became uniform, 1.00 part by mass of a 30 mass % aqueous solution of hydrogen peroxide was added thereto, and the mixture was stirred. Thereby, a slurry (1) was obtained.

Reference Examples 2 to 8

[Preparation of Slurries (2) to (8)]

Polishing liquids (2) to (8) were obtained by carrying out the operation in the same manner as in Reference Example 1, except that the various components of the slurry and the amounts thereof were changed as indicated in Table 1. Meanwhile, for the colloidal silicas A to H indicated in Table 1, commercially available abrasive grains prepared by a sol-gel method were used.

[Evaluation of Slurries (1) to (8)]

(Evaluation of Primary Particle Size)

The size of the abrasive grain attached to a copper film-clad silicon substrate was observed by the method described above, using trade name: High Resolution Field Emission type Scanning Electron Microscope S-4800 manufactured by Hitachi High-Technologies Corp. Production of an observation sample was carried out such that a chip obtained by cutting a copper film-clad wafer to a size of 2 cm on each side was immersed for 30 seconds in a container holding about 100 nit of a slurry, subsequently the chip was transferred to a container holding about 100 mL of pure water and rinsed for 30 seconds, and the chip was dried by blowing nitrogen.

(Evaluation of Zeta Potential)

The zeta potentials of the abrasive grain in the slurries (1) to (8) were measured using trade name: DELSA NANO C manufactured by Beckman Coulter, Inc. The measurement was performed three times for each of the polishing liquids, and the average value was designated as the zeta potential of the abrasive grain in the polishing liquid.

(Evaluation of pH)

The pH of the slurries (1) to (8) was measured using a pH meter manufactured by Yokogawa Electric Corp., trade name: PH81. Two-point calibration was performed using a standard buffer solution (phthalate pH buffer solution pH: 4.01 (25° C.), neutral phosphate pH buffer solution pH 6.86 (25° C.)), subsequently the electrode was immersed in the polishing liquid, and a stabilized value after a lapse of 3 minutes or longer was designated as the pH of the slurry.

(Production of Blanket Substrate)

The following substrates were cut to small pieces each measuring 2 cm×2 cm, and these specimens were used for polishing as described below.

Blanket substrate (a): a silicon substrate having silicon oxide (thickness: 1000 nm) formed thereon by a CVD method Blanket substrate (b): a silicon substrate having silicon nitride (thickness: 200 nm) formed thereon by a CVD method (Polishing Conditions)

Polishing apparatus: small-sized bench type polishing machine (manufactured by Engis Japan Corp., trade name: IMPTECH 10 DVT)

Abrasive cloth: suede-like polyurethane wet foamed type abrasive cloth (manufactured by Nitta Haas, Inc., trade name: POLITEX (registered trademark))

Speed of rotation of surface plate: 160 $min^{-1}$

Polishing pressure: 30 kPa

Amount of supply of slurry: 15 mL/min (Substrate Polishing Step)

The blanket substrates (a) to (b) were subjected to CMP polishing for 60 seconds under the polishing conditions described above, using the slurries (1) to (8).

(Evaluation Items)

Polishing rate: The polishing rates for the blanket substrates (a) to (b) that had been polished under the conditions described above were determined using the material thickness difference measured before and after polishing using a light interference type material thickness meter (manufactured by Nanometrics Japan, Ltd., trade name: NANOSPEC (registered trademark) 5100).

Selectivity: The ratio of the polishing rate for silicon oxide with respect to the polishing rate for silicon nitride (value determined by dividing the polishing rate value for silicon oxide by the polishing rate value for silicon nitride) was designated as the selectivity.

These evaluation results are presented in Table 1.

TABLE 1

|  |  |  | Ref. 1 (1) | Ref. 2 (2) | Ref. 3 (3) | Ref. 4 (4) | Ref. 5 (5) | Ref. 6 (6) | Ref. 7 (7) | Ref. 8 (8) |
|---|---|---|---|---|---|---|---|---|---|---|
|  |  | CMP slurry for metal | Ref.: Reference Example | | | | | | | |
| Composition (parts by mass) | Abrasive grain | Colloidal silica A | 5.00 | — | — | — | — | — | — | — |
| | | Colloidal silica B | — | 5.00 | — | — | — | — | — | — |
| | | Colloidal silica C | — | — | 5.00 | — | — | — | — | — |
| | | Colloidal silica D | — | — | — | 5.00 | — | — | — | — |
| | | Colloidal silica E | — | — | — | — | 5.00 | — | — | — |
| | | Colloidal silica F | — | — | — | — | — | 5.00 | — | — |
| | | Colloidal silica G | — | — | — | — | — | — | 5.00 | — |
| | | Colloidal silica H | — | — | — | — | — | — | — | 5.00 |
| | Acid | Malic acid | 0.20 | — | 0.20 | — | 0.20 | — | 0.20 | — |
| | | Succinic acid | — | 0.40 | — | 0.40 | — | 0.40 | — | 0.40 |
| | Oxidizing agent | 30% aqueous hydrogen peroxide | 1.00 | 1.00 | 1.00 | 1.00 | 1.00 | 1.00 | 1.00 | 1.00 |
| | Water | | 93.80 | 93.60 | 93.80 | 93.60 | 93.80 | 93.60 | 93.80 | 93.60 |
| | Total | | 100.00 | 100.00 | 100.00 | 100.00 | 100.00 | 100.00 | 100.00 | 100.00 |
| Evaluation item | Primary particle size [nm] | | 30 | 25 | 39 | 45 | 35 | 20 | 67 | 80 |
| | Zeta potential [mV] | | +15 | +20 | +22 | +10 | +3 | +2 | +7 | +9 |
| | pH | | 2.82 | 2.89 | 2.86 | 2.94 | 2.80 | 2.95 | 2.78 | 2.91 |
| | Silicon oxide film polishing rate [Å/min] | | 1007 | 1089 | 1229 | 1157 | 593 | 404 | 823 | 842 |
| | Silicon nitride film polishing rate [Å/min] | | 106 | 101 | 117 | 188 | 295 | 313 | 249 | 261 |
| | Silicon oxide/silicon nitride, selectivity | | 7 | 11 | 11 | 6 | 2 | 1 | 3 | 3 |

From the results of Table 1, in a region where the pH is 5.0 or lower, as the zeta potential of the abrasive grain (silica) in the slurry is larger, the polishing rate for silicon oxide tends to be higher (for example 1000 Å/min or more), and the polishing rate for silicon nitride tends to be suppressed to a lower level (for example, 200 Å/min or less). Therefore, it can be seen that as the zeta potential of the abrasive grain (silica) in the slurry is larger, the selectivity of silicon oxide with respect to silicon nitride (silicon oxide polishing rate/silicon nitride polishing rate) tends to be larger. In the following Examples, colloidal silica C was selected as the abrasive grain.

(Experiment 2: Influence of Polymer)

Example 1

[Preparation of Acrylic Acid/Methacrylic Acid Copolymer (Copolymerization Ratio: 30/70)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere.

Thereafter, a mixture of 32.05 parts by mass of acrylic acid and 89.34 parts by mass of methacrylic acid, and a solution of 14.84 parts by mass of 2,2'-azobis[2-(2-imidazolin-2-yl)propane] and 11.63 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass. Furthermore, the molecular weight of the acrylic acid/methacrylic acid copolymer thus obtained was measured by the method described above, and the weight average molecular weight was 9,000 (relative to polyethylene glycol standards). Meanwhile, since the copolymerization ratio is the same as the ratio of the incorporated components if the reaction is brought to completion, the copolymerization ratio is not particularly measured. The same also applies to the copolymers described below.

[Preparation of Slurry (9)]

The acrylic acid/methacrylic acid copolymer (copolymerization ratio: 30/70) having a non-volatile component fraction of 40%: 0.13 parts by mass, malic acid: 0.20 parts by mass, and water: 74.67 parts by mass were mixed and stiffed, and dissolution of the acrylic acid/methacrylic acid copolymer (copolymerization ratio: 30/70) and malic acid was visually checked. Thereafter, a commercially available colloidal silica having a silica content of 20% by mass and a primary particle size of 40 nm: 20.00 parts by mass (colloidal silica C described above) was added thereto. The mixture was further stirred and mixed, and when the color of the slurry became uniform, a 30% aqueous solution of hydrogen peroxide: 5.00 parts by mass was added thereto, and the mixture was stirred and mixed. Thus, a slurry (9) was prepared.

Examples 2 to 4

[Preparation of Acrylic Acid/Methacrylic Acid Copolymer (Copolymerization Ratio: 50/50)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere.

Thereafter, a mixture of 54.94 parts by mass of acrylic acid and 65.63 parts by mass of methacrylic acid, and a solution of 15.27 parts by mass of 2,2'-azobis[2-(2-imidazolin-2-yl)propane] and 11.96 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass. Furthermore, the molecular weight of the acrylic acid/methacrylic acid copolymer thus obtained was measured by the method described above, and the weight average molecular weight was 9,300 (relative to polyethylene glycol standards).

[Preparation of Acrylic Acid/Methacrylic Acid Copolymer (Copolymerization Ratio: 60/40)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere.

Thereafter, a mixture of 66.88 parts by mass of acrylic acid and 53.27 parts by mass of methacrylic acid, and a solution of 15.49 parts by mass of 2,2'-azobis[2-(2-imidazolin-2-yl)propane] and 12.14 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass. Furthermore, the molecular weight of the acrylic acid/methacrylic acid copolymer thus obtained was measured by the method described above, and the weight average molecular weight was 8,900 (relative to polyethylene glycol standards).

[Preparation of Acrylic Acid/Methacrylic Acid Copolymer (Copolymerization Ratio: 70/30)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere.

Thereafter, a mixture of 79.17 parts by mass of acrylic acid and 40.54 parts by mass of methacrylic acid, and a solution of 15.71 parts by mass of 2,2'-azobis[2-(2-imidazolin-2-yl)propane] and 12.31 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass. Furthermore, the molecular weight of the acrylic acid/methacrylic acid copolymer thus obtained was measured by the method described above, and the weight average molecular weight was 8,700 (relative to polyethylene glycol standards).

[Preparation of Slurries (10) to (12)]

Polishing liquids (10) to (12) were prepared by carrying out the operation in the same manner as in Example 1, by mixing the various components indicated in Table 2 including the various acrylic acid/methacrylic acid copolymers prepared as described above.

Comparative Example 1

[Preparation of Acrylic Acid/Methacrylic Acid Copolymer (Copolymerization Ratio: 5/95)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere. Thereafter, a mixture of 5.16 parts by mass of acrylic acid and 117.18 parts by mass of methacrylic acid, and a solution of 14.34 parts by mass of 2,2'-azobis[2-(2-imidazolin-2-yl)propane] and 11.24 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass.

Furthermore, the molecular weight of the acrylic acid/methacrylic acid copolymer thus obtained was measured by the method described above, and the weight average molecular weight was 9,100 (relative to polyethylene glycol standards).

[Preparation of Slurry (13)]

The acrylic acid/methacrylic acid copolymer (copolymerization ratio: 5/95) having a non-volatile component fraction of 40%: 0.13 parts by mass, malic acid: 0.20 parts by mass, and water: 74.67 parts by mass were mixed and stirred, and dissolution of the acrylic acid/methacrylic acid copolymer (copolymerization ratio: 5/95) and malic acid was visually checked. Subsequently, a commercially available colloidal silica having a silica content of 20% by mass and a primary particle size of 40 nm: 20.00 parts by mass was added thereto. The mixture was further stirred and mixed, and when the color of the slurry became uniform, a 30% aqueous solution of hydrogen peroxide: 5.00 parts by mass was added thereto, and the mixture was stirred and mixed. Thus, a slurry (13) was prepared.

Comparative Examples 2 to 6

[Preparation of Acrylic Acid/Methacrylic Acid Copolymer (Copolymerization Ratio: 10/90)]

75.00 parts by mass of deionized water and 75.00 parts by mass of isopropanol were introduced into a 0.5-liter flask for synthesis, and the temperature was increased to 80° C. while the mixture was stirred in a nitrogen gas atmosphere.

Thereafter, a mixture of 10.39 parts by mass of acrylic acid and 111.76 parts by mass of methacrylic acid, and a solution of 14.44 parts by mass of 2,2'-azobis[2-(2-imidazolin-2-yl)propane] and 11.32 parts by mass of concentrated sulfuric acid dissolved in 80.00 parts by mass of deionized water, were simultaneously poured into the flask over 60 minutes. The mixture was kept warm at 85° C. for 2 hours to complete the polymerization reaction, and then the resultant was cooled and taken out. Thus, an acrylic acid/methacrylic acid copolymer was obtained. The non-volatile component fraction was measured, and it was 40% by mass.

Furthermore, the molecular weight of the acrylic acid/methacrylic acid copolymer thus obtained was measured by the method described above, and the weight average molecular weight was 9,200 (relative to polyethylene glycol standards).

[Preparation of Polydimethylaminopropylacrylamide]

115.00 parts by mass of deionized water and 115.00 parts by mass of isopropanol were introduced into a 0.5-liter flask for synthesis, and the temperature was increased to 80° C. while the mixture was stirred in a nitrogen gas atmosphere.

Thereafter, a solution of 1.50 parts by mass of 2,2'-azobisisobutyronitrile dissolved in 148.5 parts by mass of N-[3-(dimethylamino)propyl]acrylamide was poured into the flask over 60 minutes. The mixture was kept warm at 90° C. for 2 hours to complete the polymerization reaction, and then the resultant was cooled and taken out. Thus, polydimethylaminopropylacrylamide was obtained. The non-volatile component fraction was measured, and it was 40% by mass.

[Preparation of Slurries (14) to (18)]

Polishing liquids (14) to (18) were prepared by carrying out the operation in the same manner as in Comparative Example 1, by mixing the various components indicated in Table 2 including the various polymers prepared as described above. Meanwhile, for the polymers used in slurries (15), (17)

and (18), commercially available polymers were used. Specific matters were as described below.

Acrylic acid/maleic acid copolymer (copolymerization ratio: 50/50): manufactured by BASF SE, product name: SOKALAN CP13S, weight average molecular weight 20,000

Polymaleic acid: manufactured by NOF Corp., product name: PMA-50W, weight average molecular weight 1,600

Polyacrylic acid: manufactured by Nippon Shokubai Co., Ltd., product name: AQUALIC (registered trademark) HL-415, weight average molecular weight 10,000

[Evaluation of Slurries (9) to (18)]

Evaluations were carried out for the polishing liquids of Examples 1 to 4 and Comparative Examples 1 to 6, in the same manner as in Reference Examples 1 to 8. These evaluation results are presented in Table 2.

Blanket substrate (d): a silicon substrate having tantalum (thickness: 300 nm) formed thereon by a PVD method Blanket substrate (e): a silicon substrate having tantalum nitride (thickness: 200 nm) formed thereon by a PVD method Blanket substrate (f): a silicon substrate having titanium nitride (thickness: 300 nm) formed thereon by a PVD method (Polishing Step of Substrate)

The blanket substrates (c) to (f) were polished under the conditions described below.

(Polishing Conditions)

Polishing apparatus: small-sized bench type polishing machine (manufactured by Engis Japan Corp., trade name: IMPTECH 10 DVT)

TABLE 2

| | | CMP slurry for metal | Ex. 1 (9) | Ex. 2 (10) | Ex. 3 (11) | Ex. 4 (12) | Com. 1 (13) | Com. 2 (14) | Com. 3 (15) | Com. 4 (16) | Com. 5 (17) | Com. 6 (18) |
|---|---|---|---|---|---|---|---|---|---|---|---|---|
| | | | Ex.: Example | | | | Com.: Comparative Example | | | | | |
| Composition (parts by mass) | Polymer | Acrylic acid/methacrylic acid copolymer (copolymerization ratio: 30/70) | 0.05 | — | — | — | — | — | — | — | — | — |
| | | Acrylic acid/methacrylic acid copolymer (copolymerization ratio: 50/50) | — | 0.05 | — | — | — | — | — | — | — | — |
| | | Acrylic acid/methacrylic acid copolymer (copolymerization ratio: 60/40) | — | — | 0.05 | — | — | — | — | — | — | — |
| | | Acrylic acid/methacrylic acid copolymer (copolymerization ratio: 70/30) | — | — | — | 0.05 | — | — | — | — | — | — |
| | | Acrylic acid/methacrylic acid copolymer (copolymerization ratio: 5/95) | — | — | — | — | 0.05 | — | — | — | — | — |
| | | Acrylic acid/methacrylic acid copolymer (copolymerization ratio: 10/90) | — | — | — | — | — | 0.05 | — | — | — | — |
| | | Acrylic acid/maleic acid copolymer (copolymerization ratio: 50/50) | — | — | — | — | — | — | 0.05 | — | — | — |
| | | Polydimethylaminopropylacrylamide | — | — | — | — | — | — | — | 0.05 | — | — |
| | | Polymaleic acid | — | — | — | — | — | — | — | — | 0.05 | — |
| | | Polyacrylic acid | — | — | — | — | — | — | — | — | — | 0.05 |
| | Abrasive grain | Colloidal silica (primary particle size: 40 nm) | 4.00 | 4.00 | 4.00 | 4.00 | 4.00 | 4.00 | 4.00 | 4.00 | 4.00 | 4.00 |
| | Acid | Malic acid | 0.20 | — | 0.20 | — | 0.20 | — | 0.20 | — | 0.20 | — |
| | | Succinic acid | — | 0.20 | — | 0.20 | — | 0.20 | — | 0.20 | — | 0.20 |
| | Oxidizing agent | 30% aqueous hydrogen peroxide | 5.00 | 5.00 | 5.00 | 5.00 | 5.00 | 5.00 | 5.00 | 5.00 | 5.00 | 5.00 |
| | Water | | 90.75 | 90.75 | 90.75 | 90.75 | 90.75 | 90.75 | 90.75 | 90.75 | 90.75 | 90.75 |
| | Total | | 100 | 100 | 100 | 100 | 100 | 100 | 100 | 100 | 100 | 100 |
| Evaluation item | Zeta potential [mV] | | +19 | +21 | +18 | +18 | +23 | +20 | +11 | +15 | +13 | — |
| | pH | | 2.78 | 3.17 | 2.81 | 3.17 | 2.86 | 3.16 | 2.77 | 3.38 | 2.67 | 3.20 |
| | Silicon oxide film polishing rate [Å/min] | | 1362 | 1380 | 1355 | 1323 | 1309 | 1346 | 1470 | 15 | 1393 | * |
| | Silicon nitride film polishing rate [Å/min] | | 66 | 39 | 36 | 42 | 89 | 78 | 207 | 26 | 197 | * |
| | Silicon oxide/silicon nitride, selectivity | | 21 | 35 | 38 | 32 | 15 | 17 | 7 | 1 | 7 | * |

* Evaluation of polishing could not be carried out due to sedimentation of the abrasive grain.

[Evaluation of Slurries (10), (12) and (13)]

For the polishing liquids of Examples 2 and 4 and Comparative Example 1, the polishing rates for a wiring metal (copper) and a barrier section (tantalum materials) were also measured as follows.

(Preparation of Blanket Substrate)

The following substrates were cut to small pieces each measuring 2 cm×2 cm.

Blanket substrate (c): a silicon substrate having copper (thickness: 1000 nm) formed thereon by a plating method Abrasive cloth: suede-like polyurethane wet foamed type abrasive cloth (manufactured by Nitta Haas, Inc., trade name: POLITEX)

Speed of rotation of surface plate: 160 min$^{-1}$

Polishing pressure: 30 kPa

Amount of supply of slurry: 15 mL/min (Evaluation Items)

Polishing rate: The polishing rates for the blanket substrates (c) to (f) were determined using a sheet resistance measuring apparatus (manufactured by Napson Corp., trade name: RT-70/RG-7B). The results are presented in Table 3.

TABLE 3

| | Example 2 | Example 4 | Comparative Example 1 |
|---|---|---|---|
| | CMP slurry for metal | | |
| | (10) | (12) | (13) |
| Copper film polishing rate [Å/min] | 3495 | 3732 | 4722 |
| Tantalum film polishing rate [Å/min] | 1213 | 1254 | 1126 |
| Tantalum nitride film polishing rate [Å/min] | 1665 | 1601 | 1416 |
| Titanium nitride film polishing rate [Å/min] | 1732 | 1694 | 1851 |

As can be seen from the results of Table 2, with regard to the slurries (9) to (12) containing a copolymer which is made of: (a) a monomer that is anionic and does not contain a hydrophobic substituent; and (b) a monomer containing a hydrophobic substituent, wherein a copolymerization ratio (a):(b) is in the range of 25:75 to 75:25, the polishing rate for silicon oxide was favorable in the range of about 1300 Å/min to 1400 Å/min, while the polishing rate for silicon nitride was suppressed to 66 Å/min or less. Furthermore, the selectivity was also high, which was 21 or more.

In contrast, with regard to the slurries (13) and (14) containing a copolymer which is made of: (a) a monomer that is anionic and does not contain a hydrophobic substituent; and (b) a monomer containing a hydrophobic substituent, but the above-mentioned copolymerization ratio is 5:95 and 10:90, respectively, suppression of the polishing rate against silicon nitride was not sufficiently achieved, and as a result, the selectivity was also decreased.

Next, with regard to the slurry (15) containing an acrylic acid/maleic acid copolymer and a slurry (17) containing polymaleic acid, which is an anionic polymer, their liquids had high polishing rates for silicon nitride, such as about 200 Å/min, and the selectivity was also as low as 7. It is contemplated to be because the slurries did not contain (b) a monomer containing a hydrophobic substituent as a copolymerization component.

Furthermore, in the slurry (16) containing polydimethylaminopropylacrylamide, which is a tertiary amine-containing cationic polymer, the polishing rate for silicon nitride was well suppressed to 26 Å/min, but the polishing rate for silicon oxide was as slow as 15 Å/min, and as a result, the selectivity was decreased to a large extent.

The slurry (18) containing polyacrylic acid which was a homopolymer of acrylic acid (copolymerization ratio between (a) and (b) being 100:0) could not be subjected to the evaluation for polishing because the abrasive grain underwent sedimentation immediately after preparation.

From the results described above, it is seen that according to the polishing method of the present invention, the polishing rate against silicon oxide is high, the polishing rate against silicon nitride can be suppressed, and the selectivity of silicon oxide with respect to silicon nitride is high. Thereby, for example, in a CMP process for a patterned substrate, silicon oxide can be polished preferentially, and polishing can be stopped at a stage in which silicon nitride is exposed. Furthermore, since the selectivity is sufficiently high, the end point for polishing can be detected by an end point detection apparatus.

Furthermore, as shown in Table 3, the slurries (10), (12) and (13) have sufficient polishing rates for a variety of metal such as copper, tantalum, tantalum nitride and titanium nitride, and thus it is understood that these polishing liquids can be applied as polishing liquids for metal. Regarding the polishing liquids (9) and (11), since the copolymerization ratios of the acrylic acid/methacrylic acid copolymer are in between the copolymerization ratios of the slurries (12) and (13), it can be expected that the polishing liquids (9) and (11) may have metal polishing rates that are similar to those of the slurries (10), (12) and (13).

As can be seen from the results described above, according to the polishing method of the present invention, there can be provided a polishing method of removing unnecessary parts of a wiring metal, a barrier metal, an insulating material and the like by polishing, and terminating polishing by using silicon nitride as a stopper.

INDUSTRIAL APPLICABILITY

According to the present invention, a high selectivity of stopping polishing with a stopper while removing metal and insulating material such as an interlayer insulating material at high polishing rates, can be realized. Thereby, high processing accuracy can be maintained, and also the process time can be shortened. According to the polishing method of the present invention, the CMP technologies can be applied to processes in addition to a wiring forming process or a metal embedded pattern forming process, and semiconductor devices having high dimensional accuracy can be designed and produced.

EXPLANATION OF REFERENCE NUMERALS

1 Interlayer insulating film
2, 6 Stopper
3, 9 Wiring metal
4 Silicon substrate
8 Barrier metal
5, 7 Interlayer insulating material

The invention claimed is:

1. A polishing method comprising the steps of:
preparing a substrate which has silicon nitride as a stopper, a wiring metal and an insulating material, and has at least a portion of the wiring metal and at least a portion of the insulating material parallel to a direction of a surface subjected to polishing;
supplying a CMP slurry in between the surface subjected to polishing and a polishing pad, and thereby polishing the wiring metal and the insulating material that are positioned parallel to the direction of the surface subjected to polishing; and
stopping polishing, after the silicon nitride is exposed and before the silicon nitride is completely removed,
wherein the CMP slurry contains:
(A) a copolymer of (a) a monomer that is anionic and does not contain a hydrophobic substituent, and (b) a monomer containing a hydrophobic substituent;
(B) an abrasive grain comprising silica or modification products of the silica;
(C) an acid;
(D) an oxidizing agent; and
(E) a liquid medium,
the component (B) has a zeta potential of +10 mV or more in the CMP slurry,
the component (A) has a copolymerization ratio between (a) and (b), wherein ((a):(b)) is 25:75 to 75:25 as a molar ratio, and
a pH is 5.0 or less.

2. The polishing method according to claim 1, wherein the CMP slurry has a ratio of the polishing rate for the insulating material with respect to the polishing rate for the silicon nitride (polishing rate for insulating material/polishing rate for silicon nitride) of 20 or more.

3. The polishing method according to claim 1, wherein the (a) monomer that is anionic and does not contain a hydrophobic substituent is at least one selected from the group consisting of acrylic acid and maleic acid.

4. The polishing method according to claim 1, wherein the (b) monomer containing a hydrophobic substituent is at least one selected from the group consisting of methacrylic acid, methyl methacrylate, ethyl methacrylate, propyl methacrylate, butyl methacrylate, 2-ethylacrylic acid, 2-propylacrylic acid, and 2-butylacrylic acid.

5. The polishing method according to claim 1, wherein the component (A) is a copolymer of acrylic acid and methacrylic acid.

6. The polishing method according to claim 1, wherein the component (C) is an organic acid.

7. The polishing method according to claim 1, wherein the CMP slurry further contains a metal corrosion inhibitor as a component (F).

8. The polishing method according to claim 1, wherein the component (A) has a copolymerization ratio between (a) and (b) such that sedimentation of the abrasive grain is prevented.

9. The polishing method according to claim 1, wherein the anionic monomer (a) has an anionic substituent selected from the group consisting of a hydroxyl group, an aldehyde group, a carbonyl group, a carboxyl group, a nitro group, a sulfone group and a phosphone group.

10. The polishing method according to claim 1, wherein the zeta potential of the component (B) in the CMP slurry is less than +35 mV.

11. The polishing method according to claim 1, wherein said pH is at least 1.0.

12. A polishing method comprising the steps of:
preparing a substrate which has silicon nitride as a stopper, a wiring metal, a barrier metal and an insulating material, and has at least a portion of the wiring metal, at least a portion of the barrier metal, and at least a portion of the insulating material parallel to a direction of a surface subjected to polishing;
supplying a CMP slurry in between the surface subjected to polishing and a polishing pad, and thereby polishing the wiring metal, the barrier metal and the insulating material that are positioned parallel to the direction of the surface subjected to polishing; and
stopping polishing, after the silicon nitride is exposed and before the silicon nitride is completely removed,
wherein the CMP slurry contains:
(A) a copolymer of (a) a monomer that is anionic and does not contain a hydrophobic substituent, and (b) a monomer containing a hydrophobic substituent;
(B) an abrasive grain comprising silica or modification products of the silica;
(C) an acid;
(D) an oxidizing agent; and
(E) a liquid medium,
the component (B) has a zeta potential of +10 mV or more in the CMP slurry,
the component (A) has a copolymerization ratio between (a) and (b), wherein ((a):(b)) is 25:75 to 75:25 as a molar ratio, and
a pH is 5.0 or less.

13. The polishing method according to claim 12, wherein the (a) monomer that is anionic and does not contain a hydrophobic substituent is at least one selected from the group consisting of acrylic acid and maleic acid.

14. The polishing method according to claim 12, wherein the (b) monomer containing a hydrophobic substituent is at least one selected from the group consisting of methacrylic acid, methyl methacrylate, ethyl methacrylate, propyl methacrylate, butyl methacrylate, 2-ethylacrylic acid, 2-propylacrylic acid, and 2-butylacrylic acid.

15. The polishing method according to claim 12, wherein the component (A) is a copolymer of acrylic acid and methacrylic acid.

16. The polishing method according to claim 12, wherein the CMP slurry further contains a metal corrosion inhibitor as a component (F).

17. A polishing method comprising the steps of:
preparing a substrate which has silicon nitride as a stopper, a wiring metal, a barrier metal, and an insulating material, has at least a portion of the wiring metal, at least a portion of the barrier metal, and at least a portion of the insulating material to parallel to a direction of a surface subjected to polishing, and has a section in which the silicon nitride, the insulating material, the barrier metal, and the wiring metal are laminated in this order perpendicular to the direction of the surface subjected to polishing;
a first polishing step of removing at least a portion of the wiring metal positioned parallel to the direction of the surface subjected to polishing, and thereby exposing a portion of the barrier metal; and
a second polishing step of removing by CMP at least a portion of the barrier metal and a portion of the insulating material that are positioned parallel to the direction of the surface subjected to polishing, thereby exposing the silicon nitride, and stopping polishing before the silicon nitride is completely removed,
at least the second polishing step including supplying a CMP slurry in between the surface subjected to polishing of the substrate and a polishing pad,
wherein the CMP slurry contains:
(A) a copolymer of (a) a monomer that is anionic and does not contain a hydrophobic substituent, and (b) a monomer containing a hydrophobic substituent;
(B) an abrasive grain comprising silica or modification products of the silica;
(C) an acid;
(D) an oxidizing agent; and
(E) a liquid medium,
the component (B) has a zeta potential of +10 mV or more in the CMP slurry,
the component (A) has a copolymerization ratio between (a) and (b), wherein ((a):(b)) is 25:75 to 75:25 as a molar ratio, and
a pH is 5.0 or less.

* * * * *